United States Patent [19]

Lee et al.

[11] Patent Number: 5,766,805

[45] Date of Patent: Jun. 16, 1998

[54] METHOD FOR FABRICATING PHASE SHIFT MASK

[75] Inventors: Jun Seok Lee; Oh Seok Han, both of Seoul, Rep. of Korea

[73] Assignee: LG Semicon Co., Ltd., Chungcheongbuk-Do, Rep. of Korea

[21] Appl. No.: 710,234

[22] Filed: Sep. 13, 1996

[30] Foreign Application Priority Data

Sep. 25, 1995 [KR] Rep. of Korea .................. 1995-31657

[51] Int. Cl.$^6$ ........................................... G03F 9/00
[52] U.S. Cl. ............................................ 430/5; 430/322
[58] Field of Search ................................ 430/5, 322, 324

[56] References Cited

U.S. PATENT DOCUMENTS

| | | | |
|---|---|---|---|
| 5,286,581 | 2/1994 | Lee | 430/5 |
| 5,322,749 | 6/1994 | Han | 430/5 |
| 5,514,499 | 5/1996 | Iwamatsu et al. | 430/5 |
| 5,604,060 | 2/1997 | Miyashita et al. | 430/5 |

OTHER PUBLICATIONS

Loong, et al.; "Simulation and fabrication of a new phase shifting mask for 0.35 μm contact hole pattern transfer: Halftone-rim"; SPIE vol. 2087 Photomask Technology and Management (1993); pp. 380–389.

Iwabuchi, et al.; "Monolayer Halftone Phase-Shifting Mask for KrF Excimer Laser Lithography"; Jpn. J. Appl. Phys. vol. 32 (1993); pp. 5900–5902.

Lin; "The Attenuated Phase-Shifting Mask"; Solid State Technology; Jan., 1992; pp. 43–47.

*Primary Examiner*—S. Rosasco
*Attorney, Agent, or Firm*—Loudermilk & Associates

[57] ABSTRACT

Methods of fabricating phase shift masks, which facilitate easy adjustment of the light transmissivity of a field region and the thickness of a phase shift mask, to thereby simplify the production process, and increase its reliability and performance. Embodiments may include the steps of providing a transparent substrate, forming a conductive light shielding layer on the transparent substrate, implanting oxygen ions into the conductive light shielding layer to form a semi-transparent film, and selectively etching the semitransparent film to form a phase shift film.

20 Claims, 11 Drawing Sheets

METHOD FOR FABRICATING PHASE SHIFT MASK

FIELD OF THE INVENTION

The present invention relates to methods for fabricating attenuating or semi-attenuating-type phase shift masks, and more particularly to methods of fabricating phase shift masks that facilitate easy adjustment of the light transmissivity of a field region and the thickness of a phase shift mask, which may simplify the production process, and increase reliability and performance.

BACKGROUND OF THE INVENTION

A general mask has an opaque light shielding layer formed on a transparent quartz or glass substrate, which allows the transmission of light at a certain phase angle (0 degrees) through the part having no light shielding layer formed thereon, and does not allow the transmission of light through the part having the light shielding layer formed thereon. Accordingly, due to the destructive interference of light occurring at the edges of the light-shielding layer, the aforementioned general mask exhibits an actual reduction of a light-shielding area, causing difficulty in an accurate definition of a desired pattern.

To solve such disadvantages of such a general mask, a phase shift mask has been developed. The phase shift mask combines phases of light transmitting through the mask in 180° or 0° intervals depending upon the arrangement of patterns in the mask, with which the destructive interference at the edges of a general mask has been solved. As regards the phase shift mask, the half-tone mask favorable for resolution of a contact hole also has been developed.

The half-tone mask has a very thin light-shielding layer so as to produce a light transmissivity in a range of 4% to 30% to shift a phase of light 180° through the phase shift mask.

Conventional phase shift masks will be explained with reference to the accompanying drawings.

FIGS. 1a to 1m are cross-sectional views of a phase shift mask illustrating a first conventional fabrication method therefor. The phase shift mask of the first conventional method has a bilayered shifter of chrome and silicon nitride ($Si_3N_4$) films. As illustrated in FIG. 1a, transparent substrate (quartz or glass) 1 is prepared, and as illustrated in FIG. 1b, chrome oxide ($CrO_3$) film 2 is deposited on transparent substrate 1. As illustrated in FIG. 1c, electron beam resist 3 is coated on chrome oxide layer 2. As illustrated in FIG. 1d, a beam projection region is defined in electron beam resist 3, onto which an electron beam is selectively projected. As illustrated in FIG. 1e, electron beam resist 3 is subjected to development to selectively remove the beam projection area, which is subjected to hardening to form electron beam resist pattern 3a.

As illustrated in FIG. 1f, using electron beam resist pattern 3a as a mask, exposed chrome oxide layer 2 is etched to form chrome oxide pattern 2a, and as illustrated in FIG. 1g, the rest of electron beam resist pattern 3a is removed. As illustrated in FIG. 1h, a planar spin-on-glass (SOG) layer is formed on the surfaces of $Cr_2O_3$ layer pattern 2a and transparent substrate 1, and as illustrated in FIG. 1i, electron beam resist 5 is coated on SOG layer 4. As illustrated in FIG. 1j, electron beam projection regions are defined in electron beam resist film 5, onto which an electron beam is selectively projected. As illustrated in FIG. 1k, electron beam resist 5 is subjected to development to selectively remove the electron beam projection regions, which are subjected to hardening to form electron beam resist pattern 5a. As illustrated in FIG. 1l, using electron beam resist pattern 5a as a mask, exposed SOG layer 4 is selectively etched to form transition layer pattern 4a. As illustrated in FIG. 1m, on removal of electron beam resist pattern 5a, fabrication of the first conventional phase shift mask is completed.

FIGS. 2a and 2b are cross-sectional views of a phase shift mask illustrating a second conventional fabrication method therefor. This second phase shift mask has the same structure as the first phase shift mask, but the fabrication method is different.

As illustrated in FIG. 2a, $Cr_2O_3$ layer 12 and SOG layer 13 are successively deposited on transparent substrate 11, on which electron beam resist 14 is coated. A beam projection region of electron beam resist 14 is subjected to selective projection of an electron beam and subjected to development to define a beam projection region. As illustrated in FIG. 2b, using electron beam resist 14 as a mask, chrome oxide film 12 and SOG layer 13 in the beam projection region are selectively removed, and on removal of electron beam resist 14, fabrication of the phase shift mask is completed.

FIGS. 3a–3c are cross-sectional views of a phase shift mask illustrating a third conventional fabrication method therefor. The third conventional method illustrates how to fabricate a mix of a half-tone phase shift mask and a rim phase shift mask.

As illustrated in FIG. 3a, chrome oxide ($Cr_2O_3$) film 22 and SOG layer 23 are successively formed on transparent substrate 21, on which electron beam resist 24 is coated. A beam projection region in electron beam resist 24 is subjected to selective projection of an electron beam and subjected to development to define a beam projection region. As illustrated in FIG. 3b, using electron beam resist 24 as a mask, SOG layer 23 in the beam projection region is selectively removed. As illustrated in FIG. 3c, in continuation, using SOG layer 23 as a mask, chrome oxide layer 22 is removed with wet etching. In this event, the aperture of chrome oxide layer 22 is formed larger than that of SOG layer 23 as illustrated.

FIGS. 4a and 4b are cross-sectional views of a phase shift mask illustrating a fourth conventional fabrication method therefor. The fourth conventional fabrication method illustrates how to fabricate a phase shift mask formed of a mix of chrome oxide and silicon oxide.

As illustrated in FIG. 4a, transition layer 32, which is a mix of a chrome oxide ($Cr_2O_3$) film and silicon oxide ($SiO_2$) film, is formed on transparent substrate 31, on which transition layer 32 and electron beam resist 33 are coated. An electron beam is projected thereon and patterned through development to expose a beam projection region. As illustrated in FIG. 4b, transition layer 32 is selectively etched, and the remaining electron beam resist pattern is removed, which completes fabrication of the fourth phase shift mask.

The aforementioned conventional methods for fabrication of a phase shift mask have the following problems. First, such conventional phase shift mask fabrication methods project an electron beam to form a mask pattern. In this case, since the material of the half-tone phase shift layer (SOG) is an insulating material that may give rise to an effect of charge-up, it has a high probability of causing a pattern proximity effect due to the charge-up effect. Second, the first and second methods stack a chrome oxide layer and SOG or silicon oxide films in fabrication of the half-tone phase shift mask. In this case, the fine texture of the chrome makes control of transmissivity difficult. Third, the rim-type phase shift mask of the third conventional method may have the

3 underlying chrome oxide layer under-cut at wet etching, which may cause degradation of the reliability. Fourth, the mix of the chrome oxide film and the silicon oxide film to form the half-tone phase shift mask in the fourth conventional method may not assure uniform transmissivity.

SUMMARY OF THE INVENTION

It is an object of the present invention to address such the aforementioned problems by providing a method for fabricating a phase shift mask, in which adjustment of the thickness is easy and the fabrication process is simple, with which the reliability as well as the performance may be improved.

To accomplish this and other objects of the present invention, there is provided a method for fabricating a phase shift mask including the steps of providing a transparent substrate, forming a conductive light shielding layer on the transparent substrate, implanting oxygen ions into the conductive light shielding layer to form a semitransparent film, and selectively etching the semitransparent film to form a phase shift film.

DESCRIPTION OF THE PREFERRED EMBODIMENTS

Preferred methods for fabricating a phase shift mask in accordance with the present invention will be explained in detail with reference to the attached drawings.

FIGS. 5a to 5i are cross-sectional views of a phase shift mask illustrating a first embodiment fabrication method in accordance with the present invention. The first embodiment phase shift mask has a light shielding layer of a metal, which is oxidized into a half-tone mask.

Figure 1A:
FIGS. 1a to 1m are cross-sectional views of a phase shift mask illustrating a first conventional fabrication method therefor.
Figure 1B:
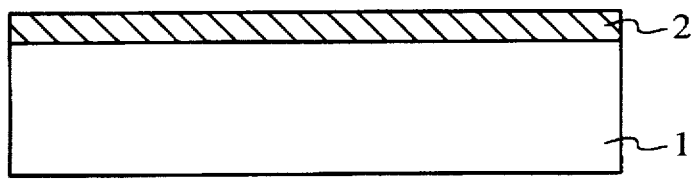
Figure 1C:
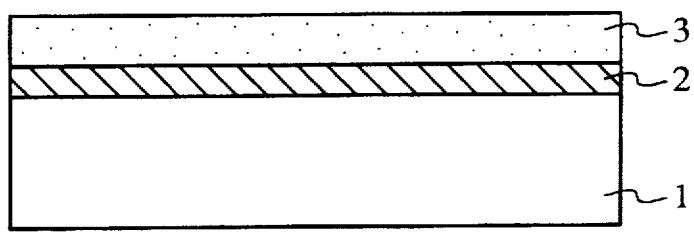
Figure 1D:
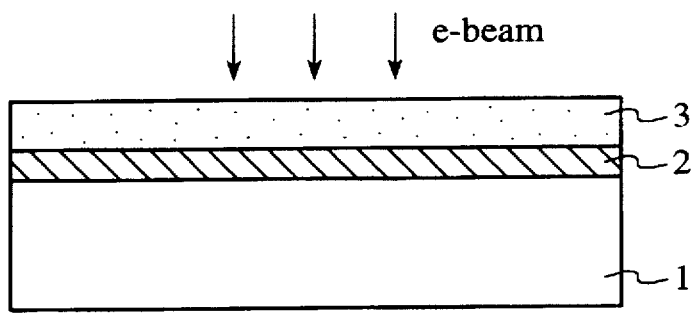
Figure 1E:
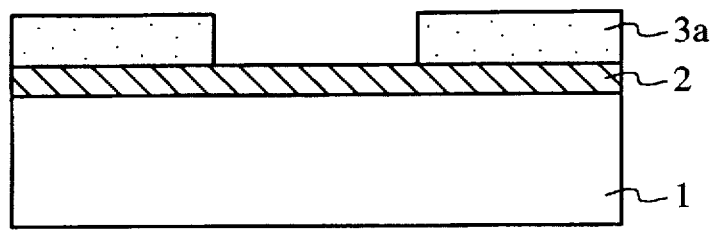
Figure 1F:
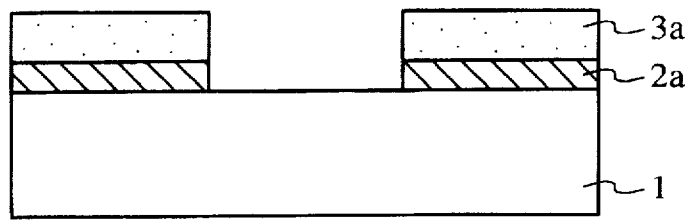
Figure 1G:
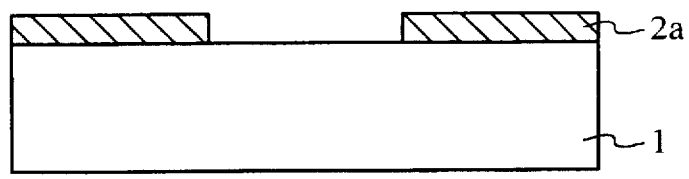
Figure 1H:
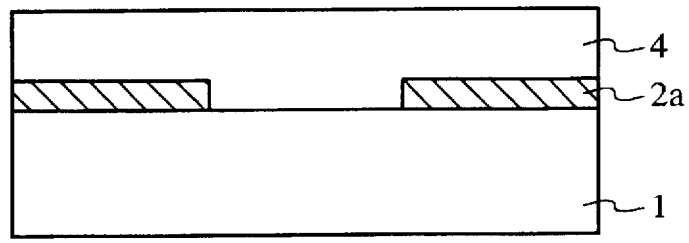
Figure 1I:
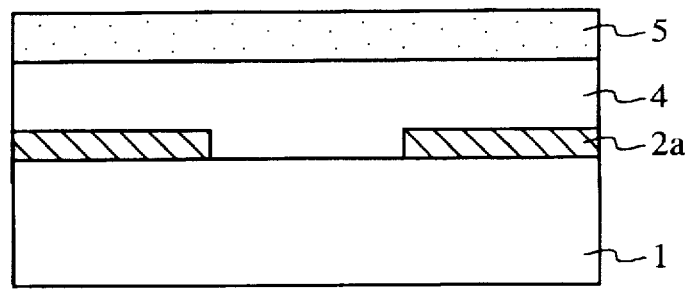
Figure 1J:
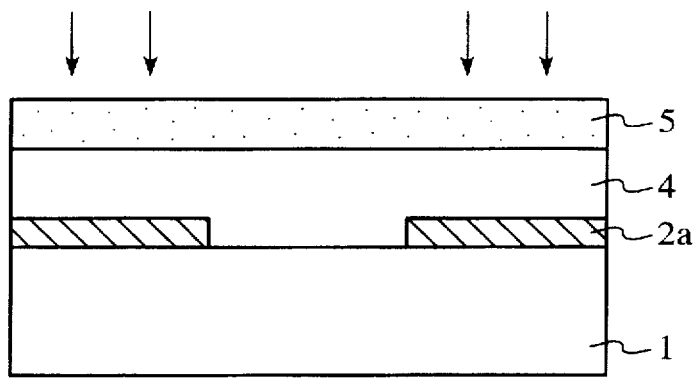
Figure 1K:
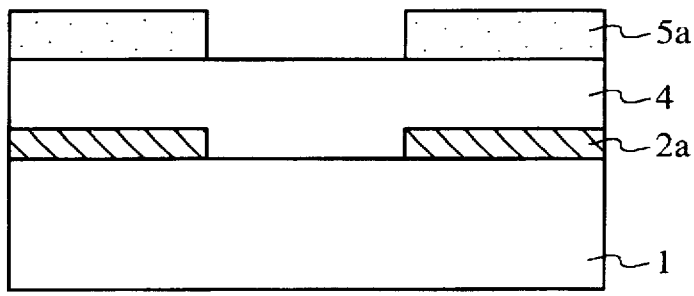
Figure 1L:
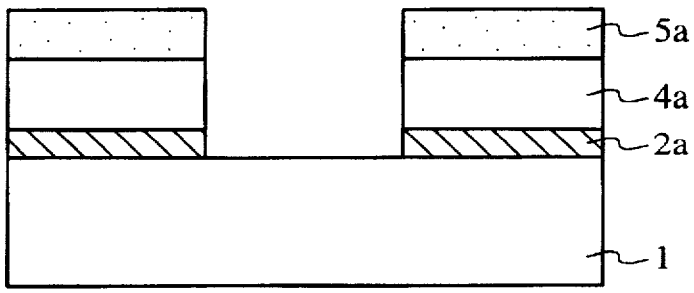
Figure 1M:
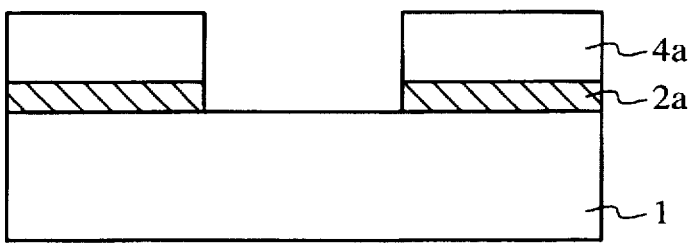
Figure 2A:
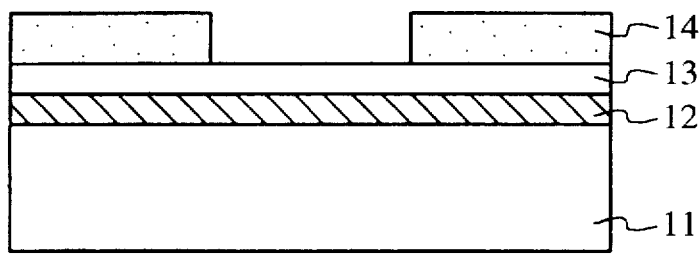
FIGS. 2a and 2b are cross-sectional views of a phase shift mask illustrating a second conventional fabrication method therefor.
Figure 2B:
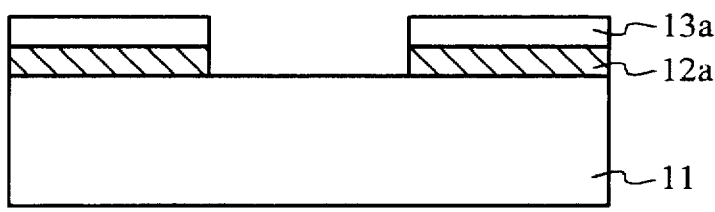
Figure 3A:
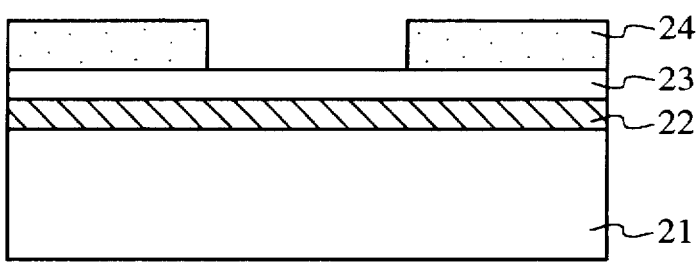
FIGS. 3a to 3c are cross-sectional views of a phase shift mask illustrating a third conventional fabrication method therefor.
Figure 3B:
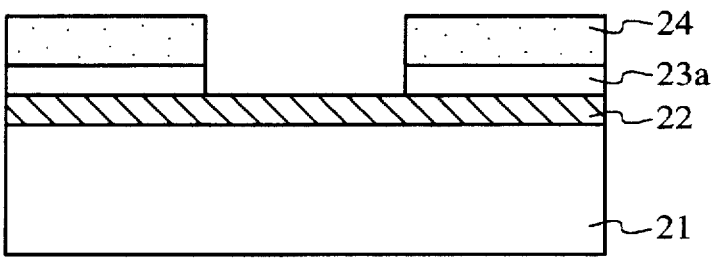
Figure 3C:
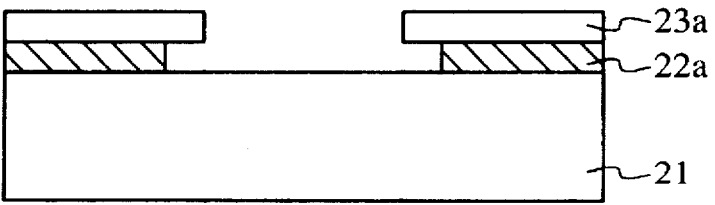
Figure 4A:
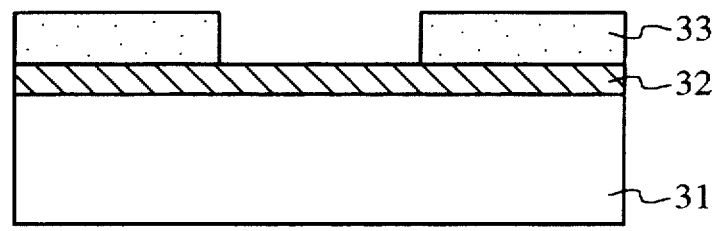
FIGS. 4a and 4b are cross-sectional views of a phase shift mask illustrating a fourth conventional fabrication method therefor.
Figure 4B:
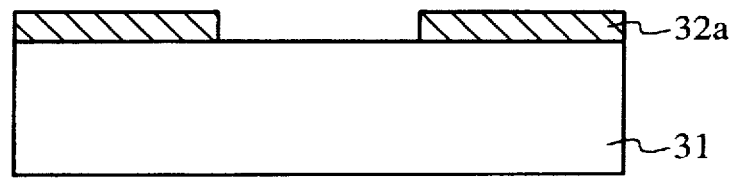
Figure 5A:
FIGS. 5a to 5i are cross-sectional views of a phase shift mask illustrating a first embodiment fabrication method in accordance with the present invention.
Figure 5B:
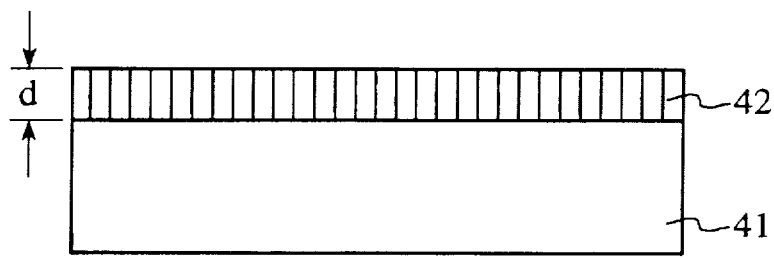
Figure 5C:
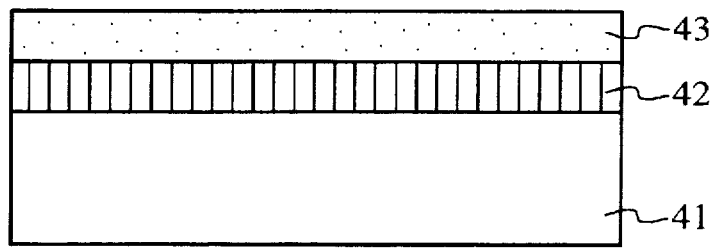
Figure 5D:
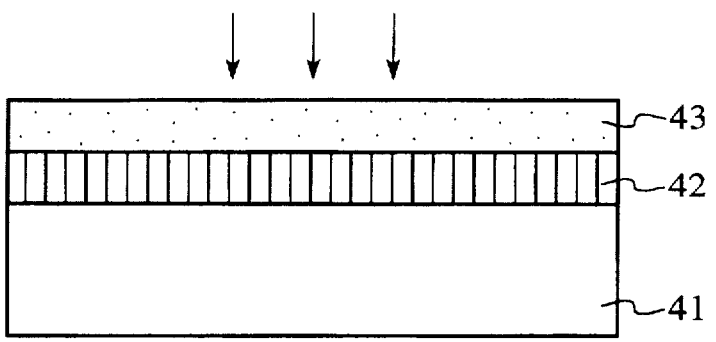
Figure 5E:
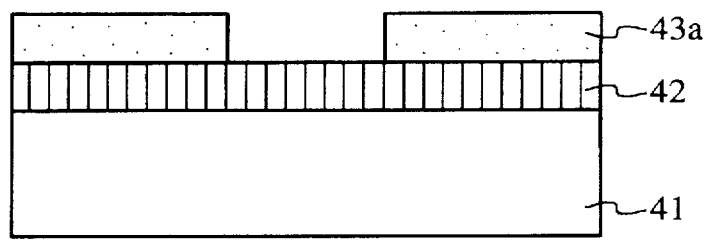
Figure 5F:
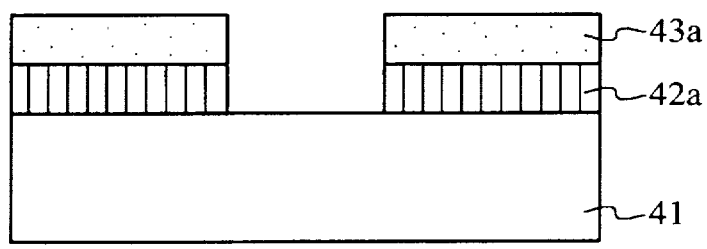
Figure 5G:
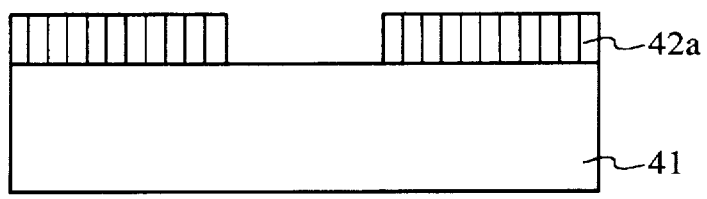
Figure 5H:
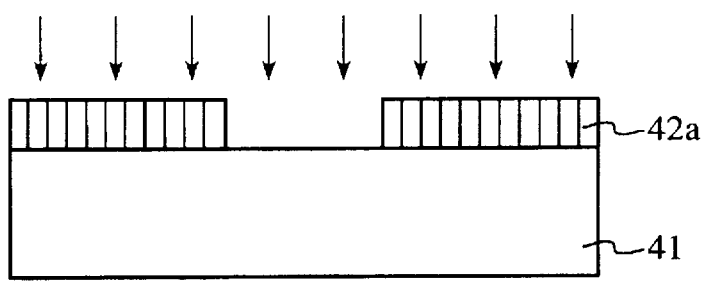
Figure 5I:
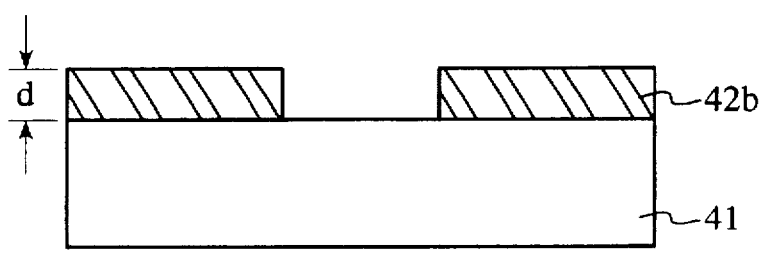

As illustrated in FIG. 5a, transparent substrate 41 is prepared, and as illustrated in FIG. 5b, light shielding layer 42 of zinc (Zn) is deposited on transparent substrate 41. In this event, the thickness "d" of the light shielding layer is deposited to satisfy the following equation.

$$d = \frac{\lambda}{2(n-1)}$$

where $\lambda$ is the wavelength of the light source and "n" is the refractive index. As illustrated in FIG. 5c, electron beam resist 43 is spin-coated on Zn layer 42. As illustrated in FIG. 5d, an electron beam is selectively projected onto an upper part of electron beam resist 43. As illustrated in FIG. 5e, electron beam resist 43 is subjected to selective development to remove the parts onto which the electron beam was projected, to form electron beam resist pattern 43a. As illustrated in FIG. 5f, using electron beam resist pattern 43a as a mask, Zn layer 42 is etched to form Zn layer pattern 42a. As illustrated in FIG. 5g, remaining electron beam resist pattern 43a is removed. As illustrated in FIG. 5h, oxygen ions are implanted into Zn layer pattern 42a, with which the Zn layer is converted into zinc oxide layer pattern 42b as illustrated in FIG. 5i. This completes fabrication of a half-tone phase shift mask in accordance with this embodiment of the present invention.

The oxygen injection density is controlled so that zinc oxide layer pattern 42b has a transmissivity of about 5% to 30%, and the thickness of the zinc oxide layer pattern will be "d", a sufficient thickness to cause a phase shift;

$$d = \frac{\lambda}{2(n-1)}$$

where "d" is a thickness of the zinc oxide layer, "n" is the factor of adjustment, and $\lambda$ is a wavelength of a light source.

In case of half-tone mask for use in an exposure apparatus that uses an i-line light source, since the wavelength $\lambda$=0.365 μm, and the factor of adjustment of the zinc oxide n=1.43, the thickness of the zinc oxide of d=0.365/(2(1.43−1))= 0.4244 μm=4244 Å will be satisfactory.

FIGS. 6a to 6i are cross-sectional views of a phase shift mask illustrating a second embodiment fabrication method of the present invention.

Figure 6A:
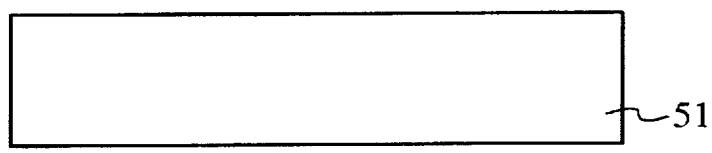
FIGS. 6a to 6i are cross-sectional views of a phase shift mask illustrating a second embodiment fabrication method of the present invention.
Figure 6B:
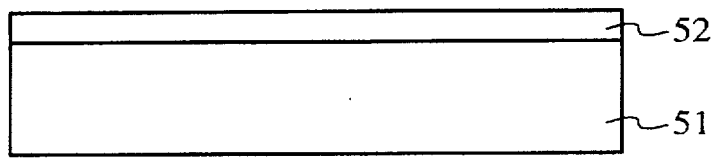
Figure 6C:
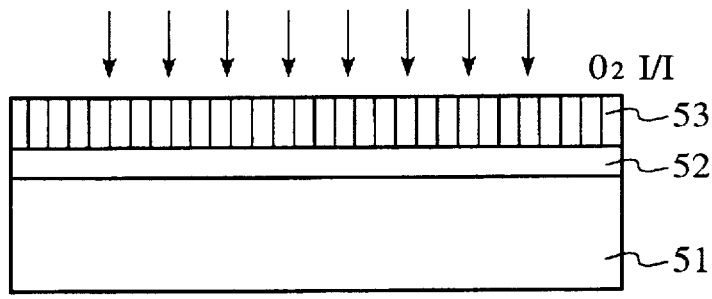
Figure 6D:
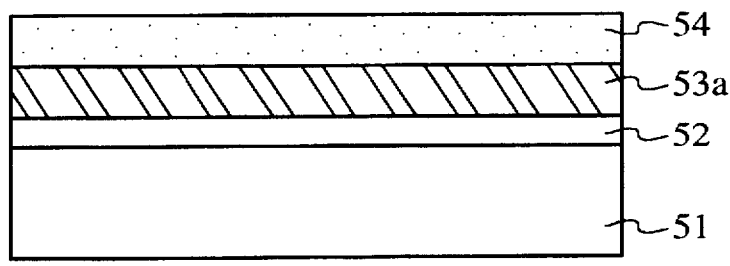
Figure 6E:
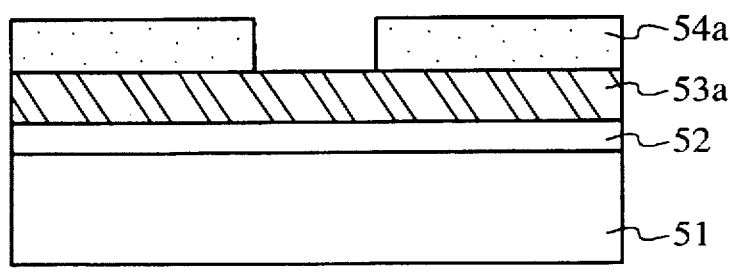
Figure 6F:
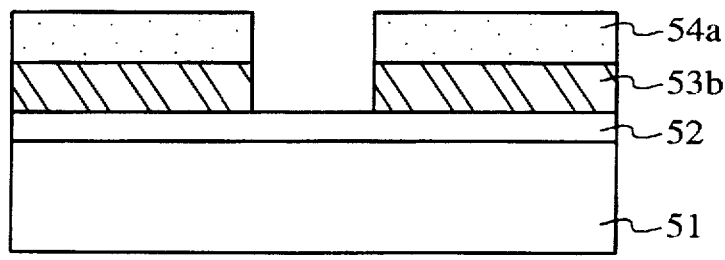
Figure 6G:
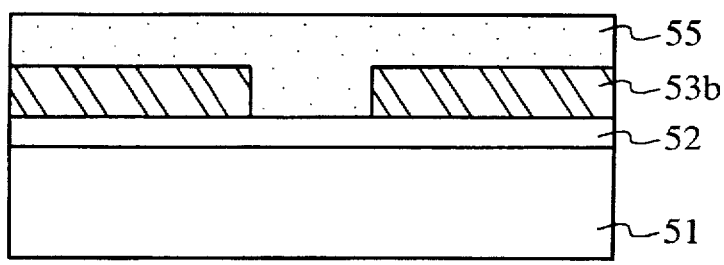
Figure 6H:
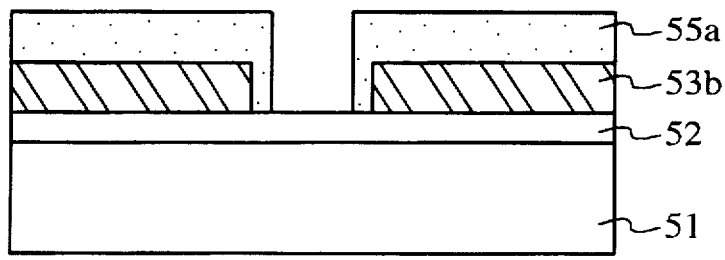
Figure 6I:
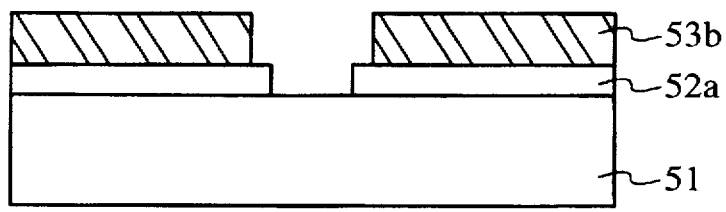

As illustrated in FIG. 6a, transparent substrate 51 is provided. As illustrated in FIG. 6b, conductive translucent layer 52 of indium tin oxide (ITO) is deposited on transparent substrate 51. As illustrated in FIG. 6c, conductive light shielding layer 53 of zinc is deposited on ITO layer 52, into which oxygen ions are implanted, to convert zinc layer 53 into zinc oxide ($ZnO_2$) layer 53a. The ion injection density is controlled so that the transmissivity of the zinc oxide layer is 5% to 30%. As illustrated in FIG. 6d, electron beam resist 54 is coated on zinc oxide layer 53a. As illustrated in FIG. 6e, electron beam resist 54 is subjected to electron beam projection and development to form electron beam resist pattern 54a. As illustrated in FIG. 6f, using electron beam resist pattern 54a as a mask, zinc oxide layer 53a is selectively etched to form zinc oxide layer pattern 53b of half-tone film. As illustrated in FIG. 6g, electron beam resist pattern 54a is removed, and electron beam resist 55 is coated on the entire surface. As illustrated in FIG. 6h, electron beam resist 55 is subjected to electron beam projection and development to form electron beam resist pattern 55a having an aperture smaller than that of zinc oxide layer pattern 53b. As illustrated in FIG. 6i, using electron beam resist pattern 55a as a mask, ITO layer 52 is etched into ITO layer pattern 52a, and on removal of electron beam resist pattern 55a, a fabrication of the phase shift mask in accordance with this embodiment is completed.

FIGS. 7a to 7j are cross-sectional views of a phase shift mask illustrating a third embodiment fabrication method in accordance with the present invention. The third embodiment fabrication method for a phase shift mask omits the masking process from the second embodiment fabrication method, using a self-alignment method.

Figure 7A:
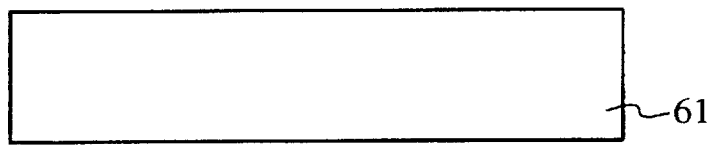
FIGS. 7a to 7j are cross-sectional views of a phase shift mask illustrating a third embodiment fabrication method of the present invention.
Figure 7B:
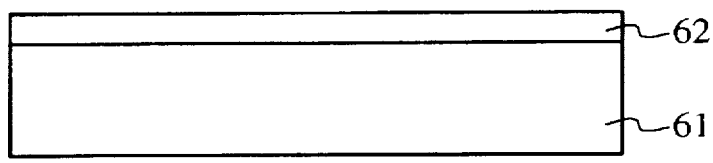
Figure 7C:
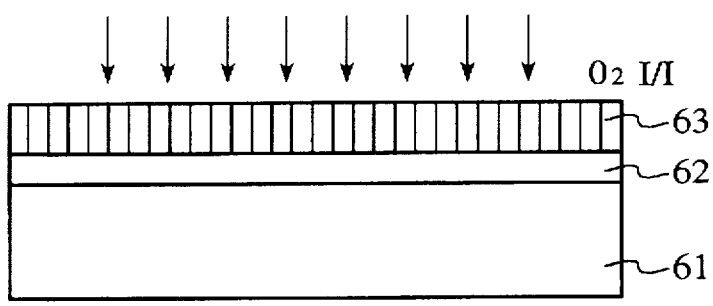
Figure 7D:
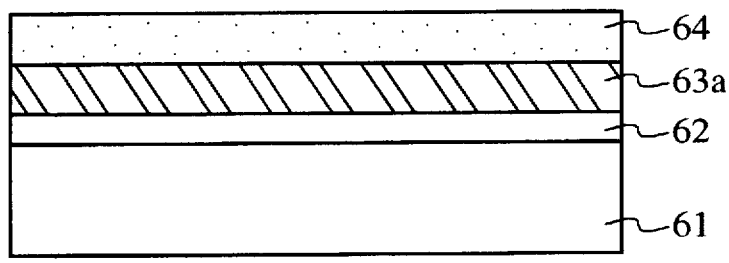
Figure 7E:
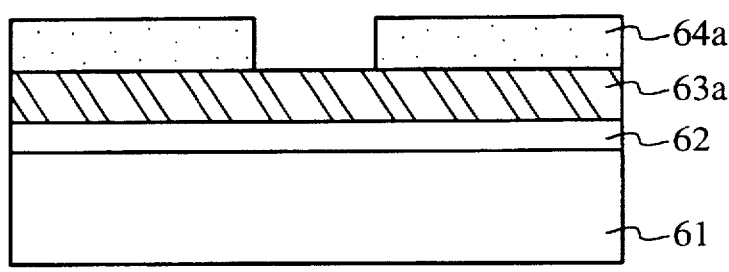
Figure 7F:
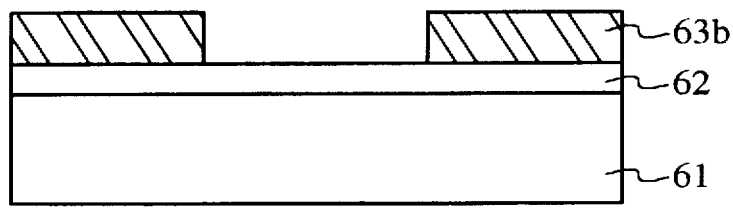
Figure 7G:
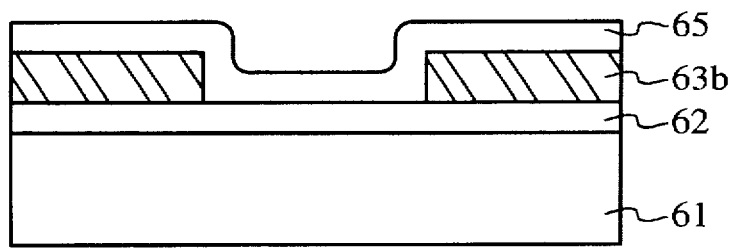
Figure 7H:
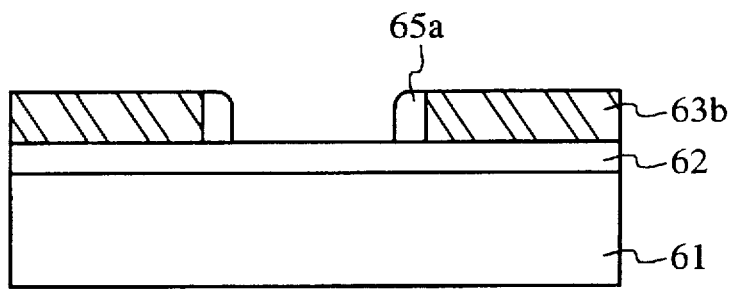
Figure 7I:
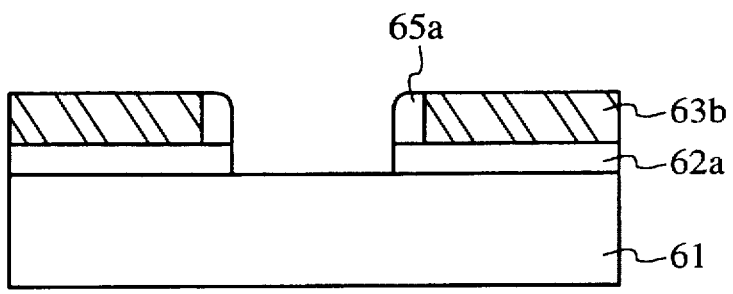
Figure 7J:
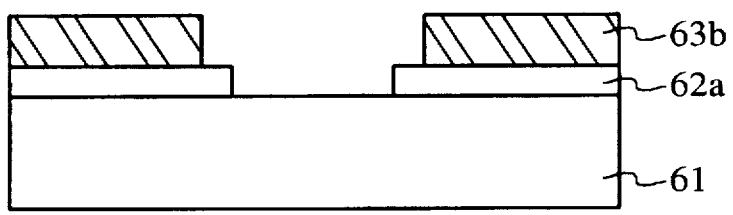

As illustrated in FIG. 7a, transparent substrate 61 is provided. As illustrated in FIG. 7b, conductive translucent layer 62 of ITO is deposited on transparent substrate 61. As illustrated in FIG. 7c, conductive light shielding layer 63 of zinc is deposited on ITO layer 62, and oxygen ions are implanted into zinc layer 63 to convert zinc layer 63 into translucent layer 63a of zinc oxide. The oxygen injection density is controlled so that the transmissivity of the zinc oxide layer is 5% to 30%. As illustrated in FIG. 7d, electron beam resist 64 is coated on zinc oxide layer 63a. As illustrated in FIG. 7e, electron beam resist 64 is subjected to electron beam projection and development to form electron beam resist pattern 64a. As illustrated in FIG. 7f, zinc oxide layer 63a is selectively etched to form zinc oxide layer pattern 63b. As illustrated in FIG. 7g, electron beam resist pattern 64a has been removed, and insulating layer 65 is coated on the entire surface. As illustrated in FIG. 7h, insulating layer 65 is etched back to form insulating sidewalls 65a at sides of zinc oxide layer pattern 63b. As illustrated in FIG. 7i, using the insulating sidewalls and zinc oxide layer pattern 63b as masks. ITO layer 62 is etched into ITO layer pattern 62a. As illustrated in FIG. 7j, on removal of the insulating sidewalls, a fabrication of the phase shift mask in accordance with this embodiment is completed.

Each of the phase shift masks in accordance with the embodiments of the present invention is a half-tone phase shift mask having the zinc oxide layer as a translucent layer and the ITO layer as a phase shift layer. As has been explained, methods for fabricating a phase shift mask in accordance with this invention may have following advantages.

First, since a conductive zinc layer and an ITO layer are used as the phase shift layer, which reduces the charge-up effect compared to the conventional insulating material, the possibility of occurrence of the pattern proximity effect due to the charge-up effect at electron beam projection is reduced. Second, since the half-tone field region and the phase shift layer are formed of a zinc oxide layer (or in combination with another layer), the fabrication process may be simplified, and, since the density of oxygen and ion injection may be quantitatively controllable, keeping a constant transmissivity for many products may become easier. Third, a dry etch, and not a wet etch, at forming an ITO pattern for forming a rim type half-tone allows a vertical profile.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method of fabricating a phase shift mask, comprising the steps of:

providing a transparent substrate;

forming a conductive light shielding layer on the transparent substrate;

implanting oxygen ions into the conductive light shielding layer to form a semitransparent film; and selectively etching the semitransparent film, wherein a phase shift film is formed.

2. The method as claimed in claim 1, wherein the conductive light shielding film comprises a metal.

3. The method as claimed in claim 2, wherein the metal comprises zinc.

4. The method as claimed in claim 1, wherein the semitransparent film is formed to have a light transmissivity of about 5% to 30% by controlling the oxygen injection density.

5. The method as claimed in claim 1, wherein a thickness d of the semitransparent film is determined to be $d=\lambda/2(n-1)$, where $\lambda$ is a wave length of a light source, and n is a refractive index.

6. The method as claimed in claim 1, wherein the semitransparent film is selectively etched prior to implanting oxygen ions.

7. A method of fabricating a phase shift mask, comprising the steps of:

providing a transparent substrate;

forming a translucent layer on the transparent substrate;

forming a conductive light shielding layer on the translucent layer;

implanting oxygen ions into the conductive light shielding layer to convert the light shielding layer into a semitransparent layer;

selectively removing the semitransparent layer to form a half-tone film, wherein a first aperture is formed in the semitransparent layer; and selectively removing the a portion of the translucent layer positioned below the first aperture, wherein a second aperture is formed in the translucent layer;

wherein a phase shift film is formed.

8. The method as claimed in claim 7, wherein the conductive light shielding film comprises a metal.

9. The method as claimed in claim 8, wherein the metal comprises zinc.

10. The method as claimed in claim 7, wherein the translucent layer comprises an oxide film, wherein the oxide film is conductive and contains tin.

11. The method as claimed in claim 10, wherein the translucent layer comprises indium tin oxide.

12. The method as claimed in claim 7, wherein the semitransparent film is formed to have a light transmissivity of about 5% to 30% by controlling the oxygen injection density.

13. The method as claimed in claim 7, wherein the second aperture has a width that is smaller that a width of the first aperture.

14. A method of fabricating a phase shift mask, comprising the steps of:

providing a transparent substrate;

forming a translucent layer on the transparent substrate;

forming a conductive light shielding layer on the translucent layer;

implanting oxygen ions into the conductive light shielding layer to convert the conductive light shielding layer into a semitransparent layer;

selectively removing the semitransparent layer to form a half-tone film, wherein a first aperture is formed in the semitransparent layer;

forming insulating sidewalls at sides of the first aperture in the half-tone film; and selectively removing a portion of the translucent layer positioned below the first aperture, wherein a second aperture is formed in the translucent layer, wherein the insulating sidewalls and the half-tone film serve as masks;

wherein a phase shift film is formed.

15. The method as claimed in claim 14, wherein the translucent layer comprises indium tin oxide.

16. The method as claimed in claim 14, wherein the conductive light shielding layer comprises a metal.

17. The method as claimed in claim 16, wherein the metal comprises zinc.

18. The method as claimed in claim 14, wherein the semitransparent film is formed to have a light transmissivity of about 5% to 30% by controlling the oxygen injection density.

19. The method as claimed in claim 14, wherein the insulating sidewalls are formed after forming the half-tone film by depositing an insulating film and etching back the insulating film.

20. The method as claimed in claim 14, wherein the second aperture has a width that is smaller that a width of the first aperture.

* * * * *